(12) United States Patent
Von Dahlen et al.

(10) Patent No.: US 11,881,856 B2
(45) Date of Patent: *Jan. 23, 2024

(54) METHOD OF RESETTING A DIGITAL COUNTER FOR A PERSONAL CARE APPLIANCE

(71) Applicant: The Gillette Company LLC, Boston, MA (US)

(72) Inventors: Judith Von Dahlen, Frankfurt (DE); Alexander Tessmann, Neu-Anspach (DE); Alexander Hiller, Kronberg (DE); Dominik Jueling, Schmitten (DE); Viktor Kraft, Weisbaden (DE)

(73) Assignee: The Gillette Company LLC, Boston, MA (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/224,751

(22) Filed: Apr. 7, 2021

(65) Prior Publication Data
US 2022/0329246 A1 Oct. 13, 2022

(51) Int. Cl.
- *B26B 21/40* (2006.01)
- *B26B 21/22* (2006.01)
- *H03K 21/38* (2006.01)

(52) U.S. Cl.
CPC ......... *H03K 21/38* (2013.01); *B26B 21/4056* (2013.01); *B26B 21/4087* (2013.01); *B26B 21/222* (2013.01)

(58) Field of Classification Search
CPC ................. B26B 21/4056; B26D 21/4087
See application file for complete search history.

(56) References Cited

U.S. PATENT DOCUMENTS

| | | |
|---|---|---|
| 5,347,715 A | 9/1994 | Friedland |
| 10,631,613 B1 | 4/2020 | Totonelly |
| 2009/0056141 A1* | 3/2009 | Barry ................. B26B 21/40 30/41.7 |
| 2009/0071008 A1 | 3/2009 | Hart et al. |
| 2010/0122462 A1 | 5/2010 | Ndou et al. |
| 2019/0224865 A1* | 7/2019 | Robinson ............ B26B 21/4081 |
| 2019/0224868 A1* | 7/2019 | Robinson ............ B26B 21/4087 |
| 2022/0001558 A1 | 1/2022 | Good et al. |
| 2023/0103785 A1 | 4/2023 | Habermann et al. |

* cited by examiner

*Primary Examiner* — Jennifer S Matthews
(74) *Attorney, Agent, or Firm* — John M. Lipchitz

(57) ABSTRACT

A method of resetting a digital counter for a personal care appliance by sending an electrical output signal from an optical sensor to a control circuit. The electrical output signal is compared to a predetermined value with the control circuit or a change in the electrical output signal from the optical sensor is detected over time. A signal is sent to a consumer user interface by the control circuit based on the electrical output signal and the predetermined value or based on the change in the electrical output signal from the optical sensor. The digital counter is reset based on an input signal from the consumer user interface.

20 Claims, 8 Drawing Sheets

METHOD OF RESETTING A DIGITAL COUNTER FOR A PERSONAL CARE APPLIANCE

FIELD OF THE INVENTION

The present invention relates to personal care appliances and more particularly to smart shaving razors having digital counters.

BACKGROUND OF THE INVENTION

Personal care appliances may include a durable component, such as a handle that is reused and a replaceable component, such as a cartridge that needs to be replaced after a certain amount of uses. Examples of personal care appliances may include, but are not limited to facial cleanser devices, toothbrushes and shaving razors. Replaceable cartridges may last for a month, or even longer. Thus, consumers typically lose track of how many times they have used the replaceable cartridges. Furthermore, performance of the replaceable cartridges may gradually decrease over time. Accordingly, the consumer may be less likely to perceive any performance changes that would indicate a new cartridge is needed.

A shaving razor or other personal care appliance may count the number of usages and feedback this information to the consumer. For some devices the manufacturer may recommend exchanging an attachment (e.g., cartridge) after a certain time of usage as some attachments decrease their functionality over the time and replacing helps to retain the performance and additional benefits of the device.

Some personal care appliances may provide a sensor for detecting the presence of a replaceable cartridge which resets an internal counter. However, these are not passive systems and require light emitter(s) (e.g., light emitting diodes or LEDs). Drawbacks of optical detection systems is that they can confuse the presence of a cartridge with just a low ambient light condition, which may be typical of a dimly lit bathroom early in the morning or late at night. Other drawbacks of present cartridge detection systems include resetting the usage count without additional feedback from the consumer thus leading to potential unintended resets.

Accordingly, there is a need to provide a personal care appliance that is capable of sensing the presence of an attachment (e.g., cartridge) in in all reasonably assumable illumination settings including low ambient light without the need for LEDs and accurately track attachment usage.

SUMMARY OF THE INVENTION

The invention features, in general, a personal care appliance with a handle having a coupler at a first end. A control circuit is positioned within the handle. A consumer user interface is operably connected to the control circuit. A digital counter is operably connected to the control circuit. An optical sensor is mounted to the coupler that sends an electrical output signal to the control circuit. A cartridge is removably mounted to the coupler. The cartridge has an opaque surface covering the optical sensor and blocking ambient light from reaching the optical sensor when mounted to the coupler. The control circuit determines an attachment status of the cartridge by comparing the electrical output signal to one or more predetermined thresholds or by detecting a change over time in the electrical output signal of the optical sensor.

The invention features, in general, a personal care appliance with a handle having a coupler at a first end. A control circuit is positioned within the handle. An optical sensor is positioned on the coupler and electrically connected to the control circuit. The optical sensor sends an electrical output signal to the control circuit. A cartridge is removably mounted to the coupler. The cartridge has an opaque surface covering the optical sensor and blocking ambient light from reaching the optical sensor. The coupler does not have a light emitter.

The invention also features, in general, a method of resetting a digital counter for a personal care appliance by sending an electrical output signal from an optical sensor to a control circuit. The electrical output signal is compared to a predetermined value with the control circuit or a change in the electrical output signal from the optical sensor is detected over time. A signal is sent to a consumer user interface by the control circuit based on the electrical output signal and the predetermined value or based on the change in the electrical output signal from the optical sensor. The digital counter is reset based on an input signal from the consumer user interface.

The invention also features, in general, a method of resetting a digital counter for a personal care appliance by sending an electrical output signal from an optical sensor to a control circuit. The electrical output signal is compared to a predetermined value with the control circuit or detecting a change over time in the electrical output signal from the optical sensor. A signal is sent to a smart device by the control circuit based on the electrical output signal and the predetermined value or based on the change over time in the electrical output signal from the optical sensor. The digital counter is reset based on an input signal the smart device.

The invention also features, in general, a method of resetting a digital counter for a personal care appliance by sending an electrical output signal from an optical sensor to a control circuit. The electrical output signal is compared to at least one predetermined value with the control circuit or a change over time in the electrical output signal from the optical sensor is detected by the control circuit. A signal is sent from the control circuit to a cloud based on the electrical output signal of the optical sensor. A signal is sent from the cloud to a smart device or a consumer user interface on a personal care appliance. The digital counter is reset by sending a signal from the smart device or the consumer user interface to the digital counter.

The details of one or more embodiments of the invention are set forth in the accompanying drawings and the description below. It is understood that certain embodiments may combine elements or components of the invention, which are disclosed in general, but not expressly exemplified or claimed in combination, unless otherwise stated herein. Other features and advantages of the invention will be apparent from the description and drawings, and from the claims.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings.

DETAILED DESCRIPTION OF THE INVENTION

Figure 1:
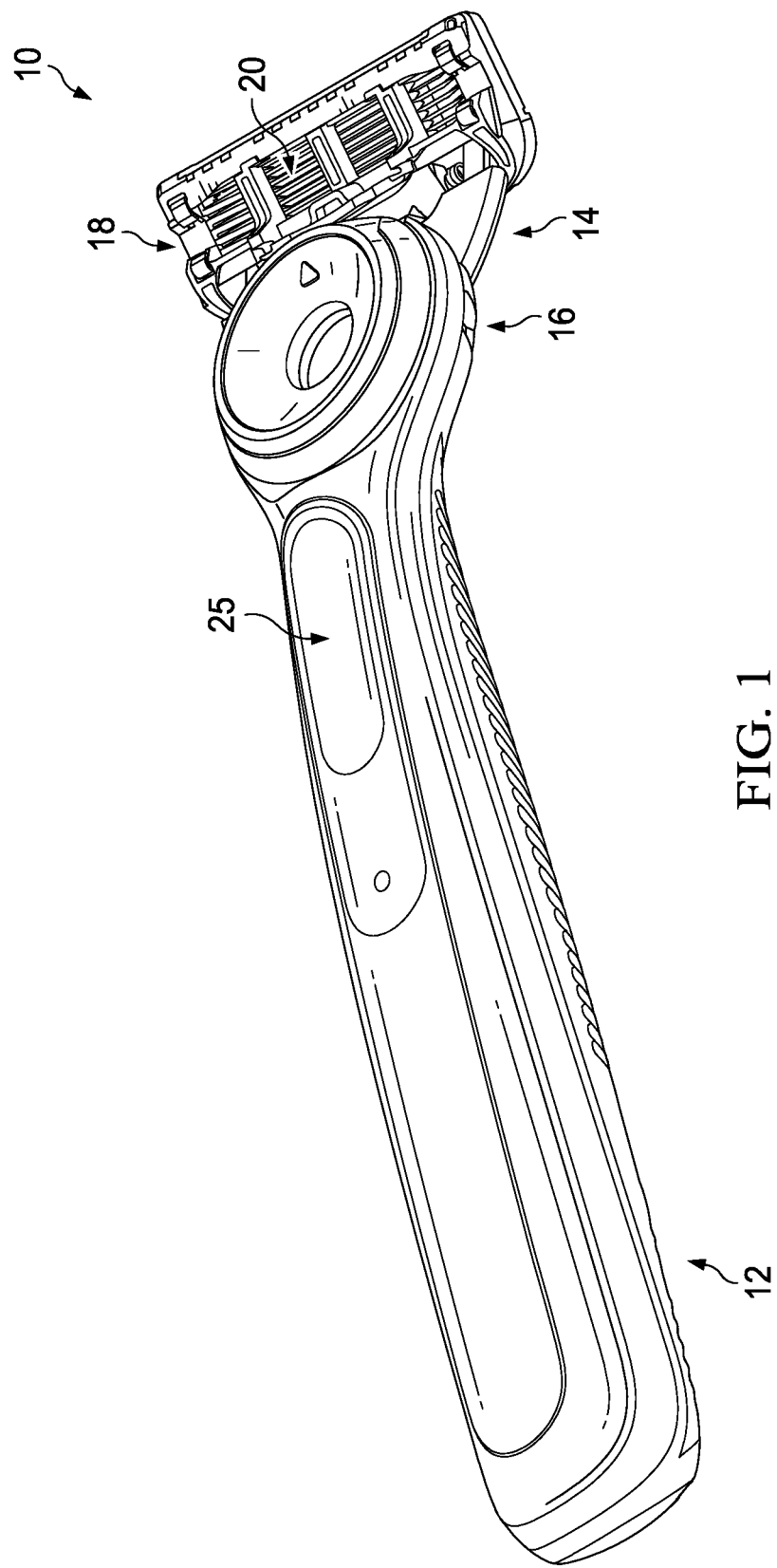
FIG. 1 is a top perspective view of one possible embodiment of a personal care appliance having an attached cartridge.
Figure 2:
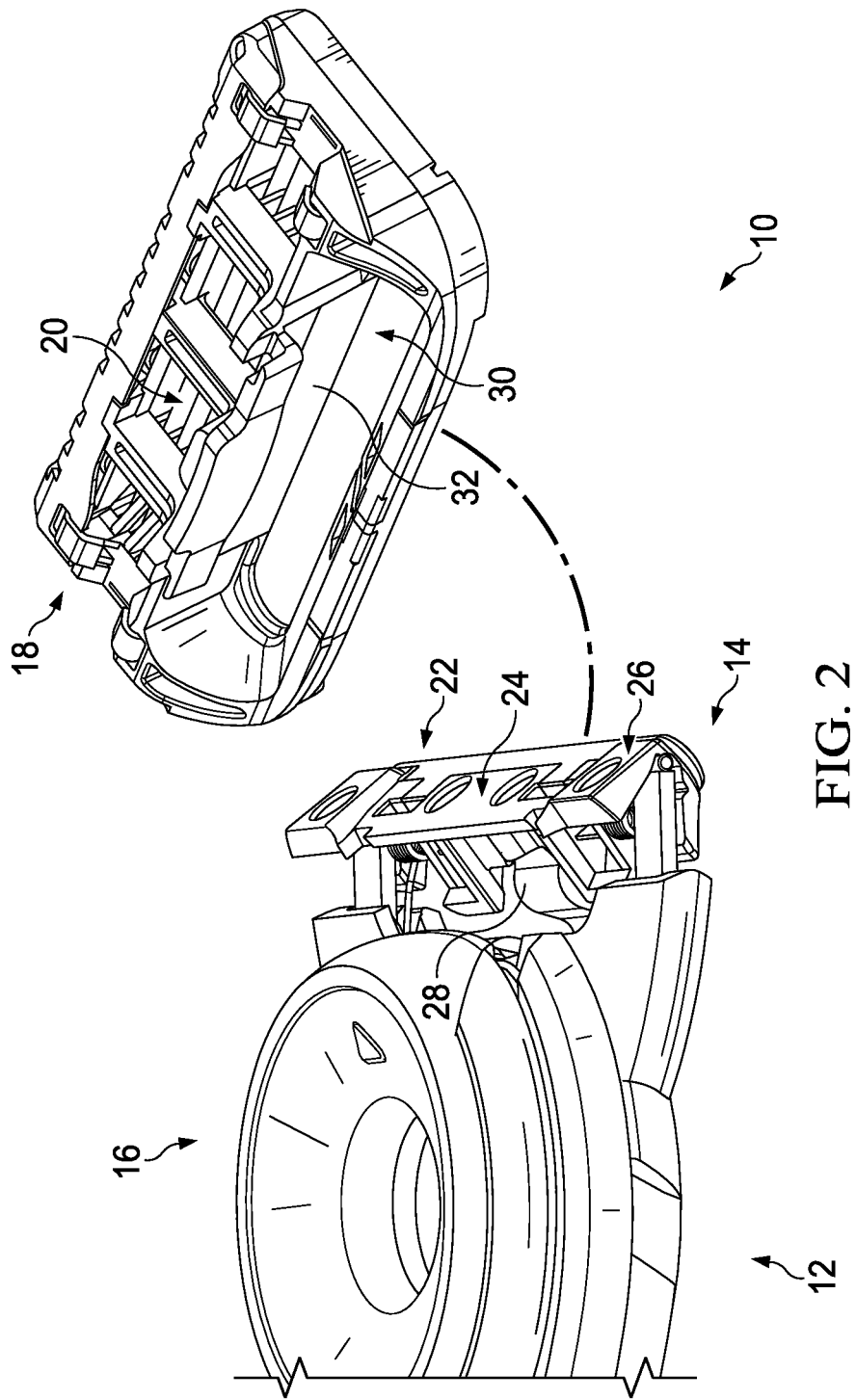
FIG. 2 is an enlarged perspective view of a proximal end portion of the personal care appliance with the cartridge detached.

Referring to FIGS. 1 and 2, one possible embodiment of the present disclosure is shown illustrating a personal care appliance 10. The personal care appliance 10 may include a handle 12 having a coupler 14 at a first end 16 of the handle. A cartridge 18 may be removably mounted to the coupler 14. The cartridge 18 may include one or more blades 20 for shaving. Although the personal care appliance 10 shown is a shaving razor, it is understood the personal care appliance may also include toothbrushes or other cosmetic devices having a replaceable cartridge. The handle 12 may include an optical sensor subassembly 22. The optical sensor subassembly 22 may have at least one optical sensor (not shown) positioned within a pocket 24 of a housing 26. The at least one optical sensor (not shown) may be mounted to a printed circuit board 28 (e.g., a flexible printed circuit board) that extends from the coupler to a cavity within the handle 12. It is understood that in certain embodiments, the printed circuit board 28, as well as other electrical components may be positioned outside of the handle 12 and sealed from water ingress. A consumer user interface 25 may be operably connected to a control circuit (not shown). In certain embodiments, the consumer user interface 25 may be positioned on the handle 12. The consumer user interface (e.g., a touch screen) may provide information to the user and receive input from the user regarding the function of the personal care appliance 10. It is understood that the consumer user interface 25 may also be physically separated from the handle 12, such as on a smart device (e.g., a phone or watch) or computer in the form of an app or a push notification requesting an input from the user. In such situations the control circuit (not shown) may still be operably connected to the user interface 25 when the handle 12 is a connected handle that is wirelessly or wire connected to the smart device or computer having the consumer interface. The communication between handle 12 and user interface 25 may happen directly (e.g., peer-to-peer) or via an intermediate cloud service.

The cartridge 18 may define an opening 30 dimensioned to receive the coupler 14. As will be explained in greater detail below, the opening 30 may be defined by an opaque surface 32 that covers the pocket 24 (e.g., in a planar direction) and the optical sensor (not shown) when the cartridge 18 is properly mounted to the coupler 14. It is understood that tolerances may still allow for small gaps, thus it is understood the pocket 24 may not be completely covered. The opaque surface 32 may prevent any ambient light from reaching the optical sensor and may also prevent light from reflecting light towards the optical sensor (not shown). When the cartridge 18 is removed from the coupler 14, ambient light may reach the optical sensor 38.

Figure 3:
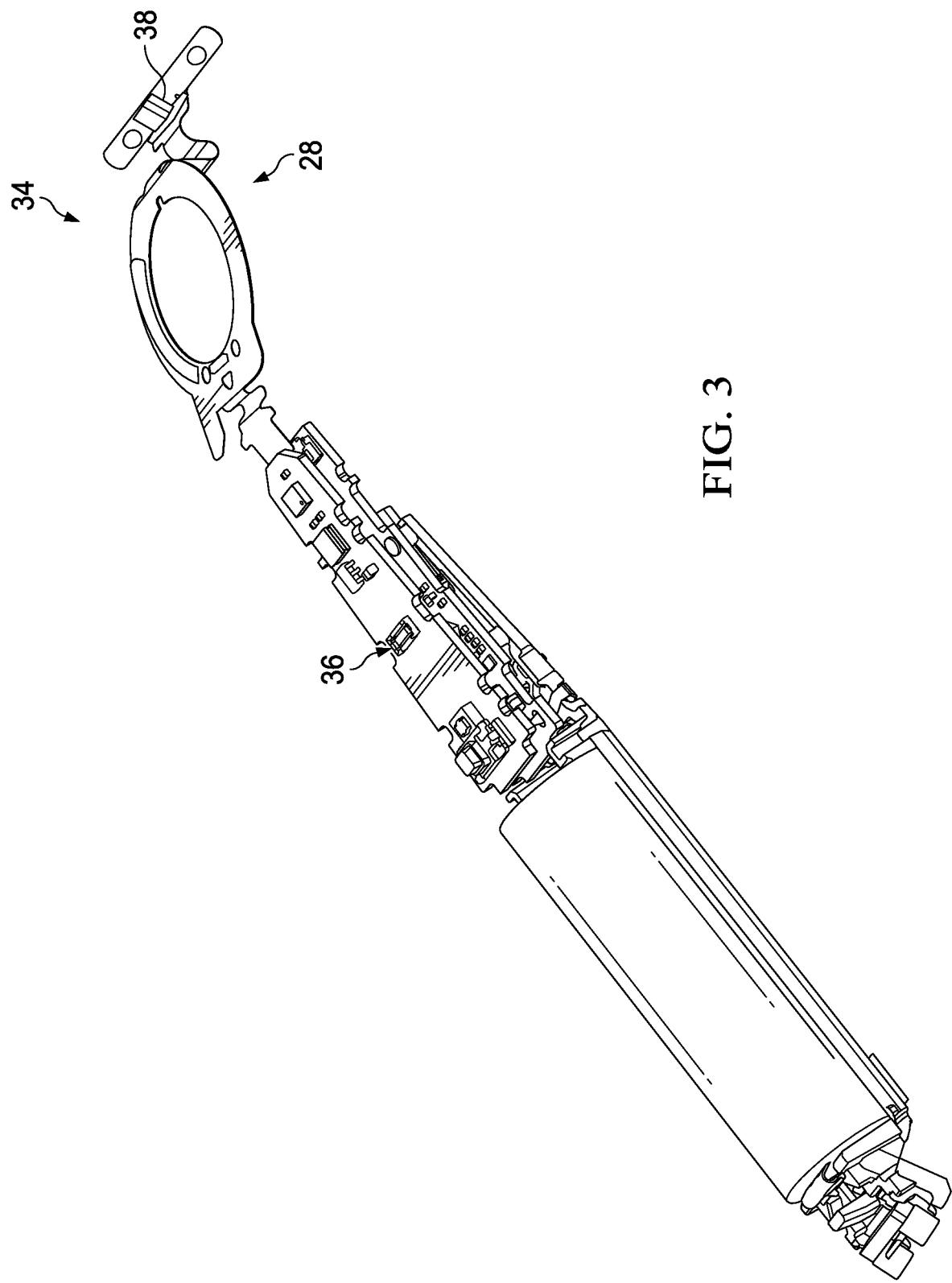
FIG. 3 is a perspective view of an electronic subassembly of the personal care appliance of FIG. 1.

Referring to FIG. 3, a perspective view of an electronic subassembly 34 of the personal care appliance 10 of FIG. 1 is illustrated. The electronic subassembly 34 may be positioned within the handle 12 of FIG. 1. The electronic subassembly 34 may include a control circuit 36 (e.g., a microcontroller). The control circuit 36 may be in electrical communication with the printed circuit board 28, which is in electrical communication with an optical sensor 38 mounted to the printed circuit board 28. The optical sensor 38 may produce one or more electrical output signals. For example, the optical sensor may produce an electrical output signal when ambient light is blocked from reaching the optical sensor 38 (e.g., the cartridge 18 is mounted to the coupler 14, as shown in FIG. 1). The optical sensor 38 may also produce the electrical output signal when ambient light is received by the optical sensor 38 (e.g., the cartridge 18 is separated from the coupler 14, as shown in FIG. 2). It is understood that the electrical output signal may change over time and as the cartridge 18 is mounted to the coupler 14 and removed from the coupler 14.

The optical sensor 38 may be able to distinguish between a close to zero lux condition, in which the cartridge 18 is mounted to the coupler 14 and the opaque surface blocks ambient light and a low lux condition (e.g., 1 lux) in which the cartridge 18 is not mounted to the coupler 14, but the personal care appliance 10 is in a dimly lit room. It is understood it may be difficult to achieve an absolute dark condition, even with the cartridge 18 mounted to the coupler 14. Accordingly, the optical sensor 38 may send the electrical output signal to the control circuit 36 that corresponds to a reading from about zero lux to about 0.5 lux. The control circuit 36 may compare the electrical output signal to one or more predetermined threshold values. For example, the electrical output signal may be compared to a predetermined valued stored by the control circuit 36 that represents ambient light being blocked from the optical sensor. In certain embodiments, a first predetermined value may represent a condition of the cartridge 18 attached to the coupler 14. If the electrical output signal is less than the first predetermined value, the control circuit 36 may determine the cartridge 18 is attached to the coupler 14. If the electrical output signal is greater than or equal the first predetermined value, then the control circuit 36 may determine the cartridge 18 has been removed from the coupler 14. As will explained in greater detail below, the control circuit 36 may send various signals depending if it determines the cartridge 18 is attached or removed from the coupler 14.

In certain embodiments, the first predetermined value may not be determined by the manufacturer. For example, the control circuit 36 may run a diagnostic test to have the consumer determine the correct light level for the first predetermined value. The consumer user interface 25 (FIG. 1) may ask the consumer to remove the cartridge 18. The consumer may confirm via the consumer user interface 25 (FIG. 1) the cartridge 18 (FIG. 1) has been removed. The control circuit 36 may then have the optical sensor 38 send the electrical output signal, which may be stored by the control circuit 36. The consumer user interface 25 may then ask the consumer to attach the cartridge 18 to the coupler 14 (FIG. 1). The consumer may confirm via the consumer user interface 25 the cartridge 18 is attached (FIG. 1). The control circuit 36 may then have the optical sensor 38 send the electrical output signal again, which may be stored by the control circuit 36. If the consumer starts using the personal care appliance 10 (FIG. 1) in different lighting conditions, then the consumer may run the diagnostic test again, but under the new lighting conditions.

Figure 4:
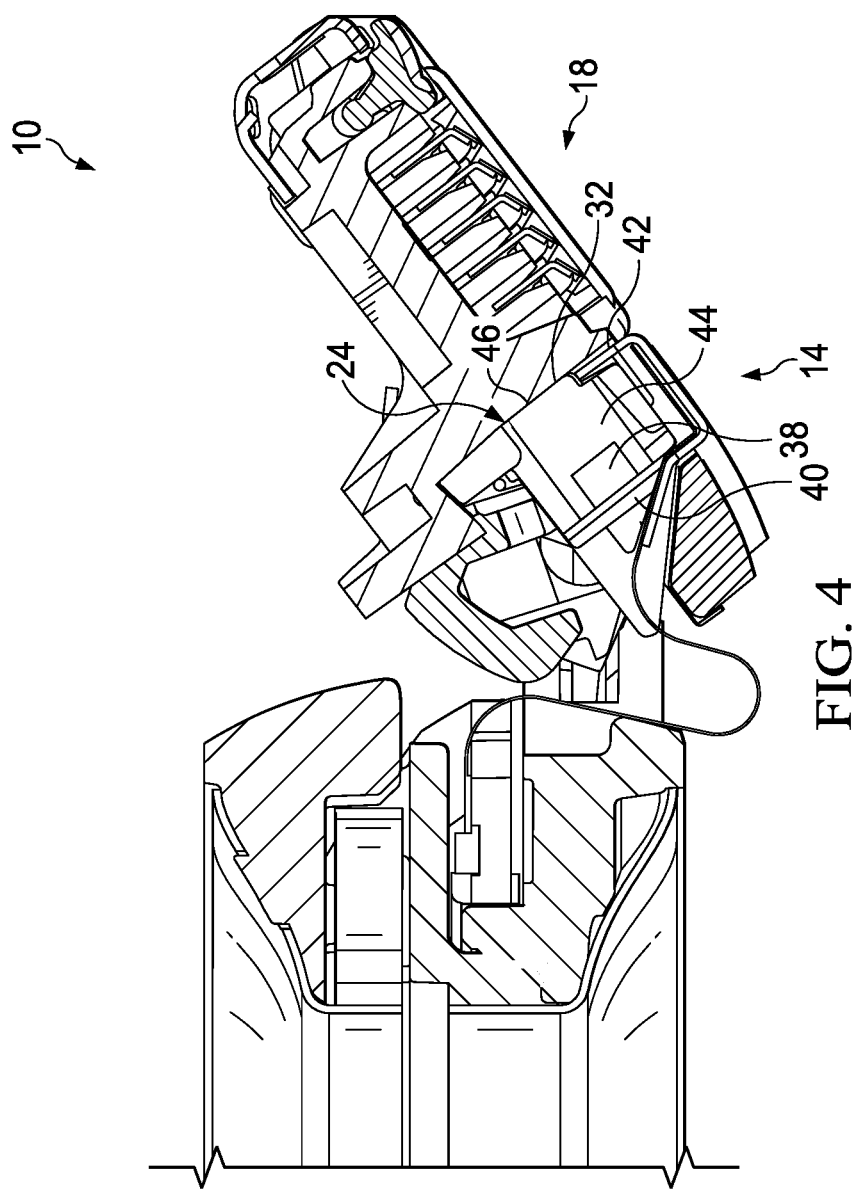
FIG. 4 is a cross section view of the personal care appliance, taken generally along the line 4-4 of FIG. 1

Referring to FIG. 4, a cross section view of the personal care appliance 10, taken generally along the line 4-4 of FIG. 1 is illustrated. FIG. 4 shows the cartridge 18 mounted to the coupler 14. The coupler 14 may be positioned within the opening 30 (FIG. 2) with the opaque surface 32 positioned over (i.e., covering) the optical sensor 38. The pocket 24 may be dimensioned to receive the optical sensor 38. The optical sensor 38 may be positioned towards a lower portion 40 of the pocket 24 away from a top surface 42 of the coupler 14 that is adjacent to the opaque surface 32.

The optical sensor 38 may include an over molded light guide 44. The light guide 44 may facilitate guiding ambient light to the optical sensor 38 and may also prevent the optical sensor 38 from being damaged either physically (e.g., from being dropped) or chemically (e.g., by chemicals typically found in personal hygiene appliances). The light guide 48 may comprise a transparent or translucent material, which only influences the transmission of ambient light to the optical sensor 38 to an irrelevant extent. For example, materials may include silicone, thermoplastic elastomers, various curable liquid adhesives and/or polycarbonate. A softer material, such as silicone having a shore A durometer of about 5 to about 70, more preferably in the 30-50 range, may also provide improved sealing characteristics against water ingress and allow for less stringent assembly tolerances (e.g., assembly of the light guide 44 within the pocket 24). The light guide 44 may completely surround the optical sensor 38 (e.g., side surfaces and top surface). The light guide 44 may be inserted or positioned within the pocket 24 such that a top surface 46 is flush with the top surface 42 of the coupler 14. In certain embodiments, the optical sensor 38 may be recessed (e.g., by about 0.1 mm to about 3.0 mm). A small recess or flush surface may help to accommodate tolerance variations or to prevent any ambient light from reaching the optical sensor when the cartridge 18 is mounted to the coupler 14.

Figure 5:
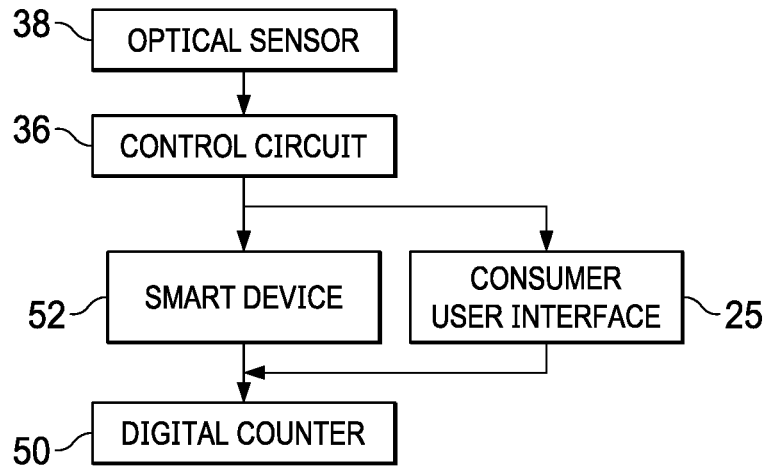
FIG. 5. is a block diagram that depicts a method of resetting a digital counter according to one or more embodiments shown and described herein.

Referring back to FIG. 1 and with additional reference to FIG. 5, the personal care appliance 10 may include a digital counter 50 that can be reset. FIG. 5 illustrates a block diagram is shown depicting one possible embodiment of a method of resetting a digital counter 50. The digital counter 50 may generate usage data about the personal care appliance 10 (FIG. 1), such as count time (e.g., shaving duration), incidence of usage, or strokes (e.g., shaving strokes). The optical sensor 38 may send the electrical output signal to the control circuit 36. The control circuit 36 may then compare the electrical output signal to the first predetermined threshold value stored in the control circuit 36. In certain embodiments, the first predetermined value for the electrical output signal may correspond to an irradiation of the optical sensor 38 of about 0.5 mW/m$^2$ or to an illumination of about 0.5 lux. In other embodiments, the first predetermined value may correspond to 1.0 mW/m$^2$ or 1.0 lux. If the electrical output signal is below these values, the cartridge 18 may be attached to the coupler 14. The consumer user interface 25 may display the status of the cartridge 18 (e.g., displaying words and/or a cartridge symbol). It is understood the consumer user interface 25 may be positioned somewhere on the handle 12 of FIG. 1; however, in lieu of or in addition to, a smart device 52 (e.g., computer, tablet, phone or watch) may also be provided with consumer user interface.

When the cartridge 18 is removed, the electrical output signal will be greater than or equal to the first predetermined value. Accordingly, the control circuit 36 may send a signal to the consumer user interface 25 on the handle 12 and/or the smart device 52 prompting a consumer to input a response, noting the cartridge 18 has been removed from the coupler 14. The consumer user interface 25 and/or the smart device 52 may then send a signal resetting the digital counter 50. Alternatively, the control circuit may bypass the consumer interface 25 and reset the shave stroke counter. However, this may not be advantageous, as the digital counter 50 may be reset without the consumer's knowledge when the cartridge 18 is reattached after it was accidentally detached (e.g., during a drop). The consumer user interface 25 and/or smart device 52 allows the user to confirm the status of the cartridge 18.

The control circuit 36 comparing the electrical output signal to the predetermined value may work for a wide range of ambient light conditions. However, it may be possible for such a system to confuse the attachment condition of the cartridge 18 in very bright light conditions where the control circuit 36 sends a signal that the cartridge is attached, but in reality, it is not. Accordingly, the control circuit 36 may in lieu of or in addition to, may detect a change in the electrical output signal over time to compensate for such conditions. The time variable may be determined by the approximate amount of time it takes to detach the cartridge 18 from the coupler 14 plus the time to attach the cartridge 18 to the coupler 14.

If the control circuit detects a drop in the electrical output signal over time, then the control circuit 36 may send a signal to the consumer user interface 25 and/or the smart device 52 prompting a consumer to input a response, noting the cartridge 18 has been removed from the coupler 14. The consumer user interface 25 and/or the smart device 52 may then send a signal to reset a digital counter 50. The amount of the change in the electrical output signal over time may also be stored by the control circuit 36 (e.g., as a second predetermined value).

Figure 6:
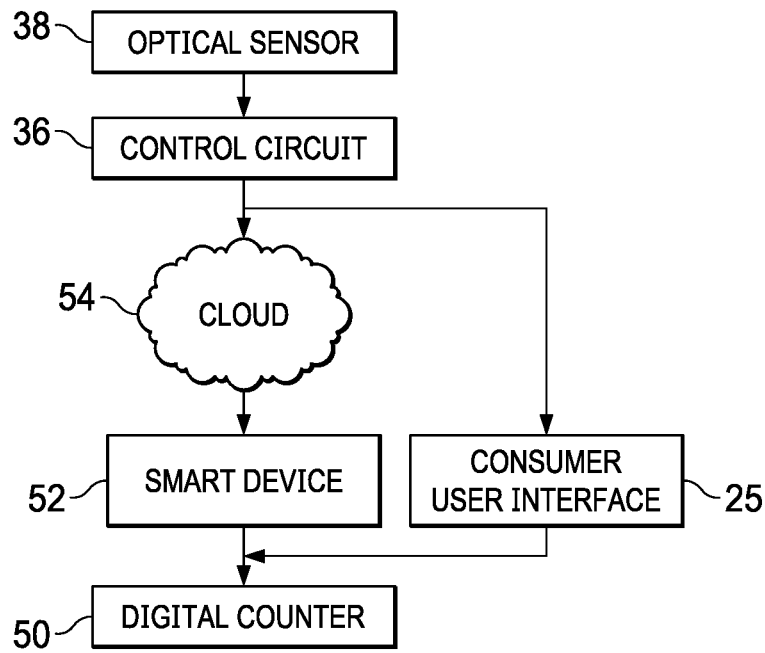
FIG. 6. is a block diagram that depicts another method of resetting a digital counter according to one or more embodiments shown and described herein.

Referring to FIG. 6, a block diagram is shown depicting another possible embodiment of a method of resetting the digital counter 50. As previously described for the embodiment disclosed in FIG. 5, the optical sensor 38 may send an electrical output signal to the control circuit 36. The control circuit 36 may then send a signal to the cloud 54. The cloud 54 may use an algorithm to process the signal from the control circuit 36 along with additional (e.g., usage information provided by the consumer and/or the control circuit 36). The cloud 54 may then send a signal to the consumer user inter face 25 and/or the smart device 52 notifying the user and requesting confirmation. The consumer may provide an input to the consumer user inter face 25 and/or the smart device 52 to reset the digital counter 50.

Figure 7A:
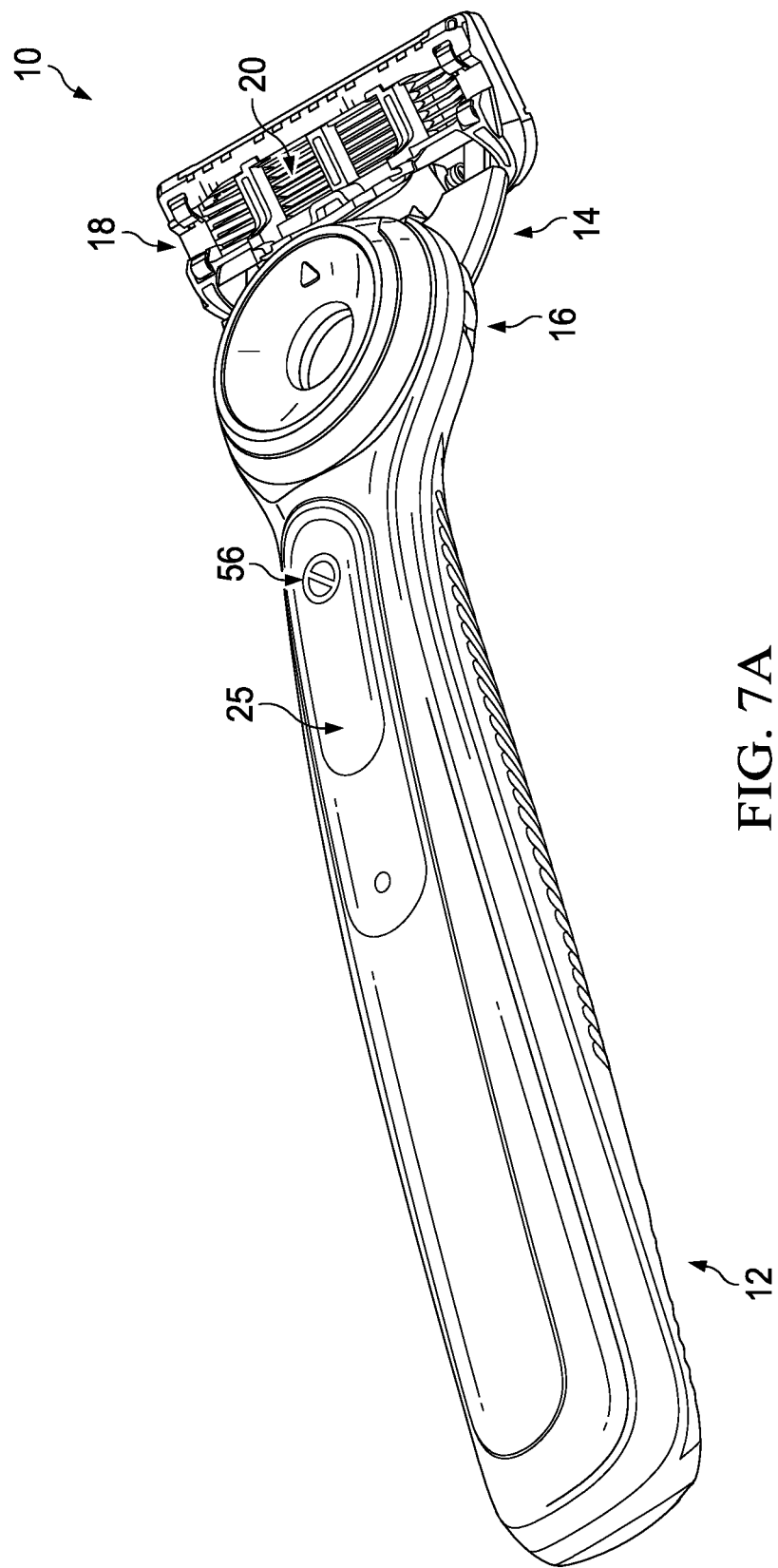
FIGS. 7A-7C are top perspective views of the personal care device of FIG. 1 with having display notifications.
Figure 7B:
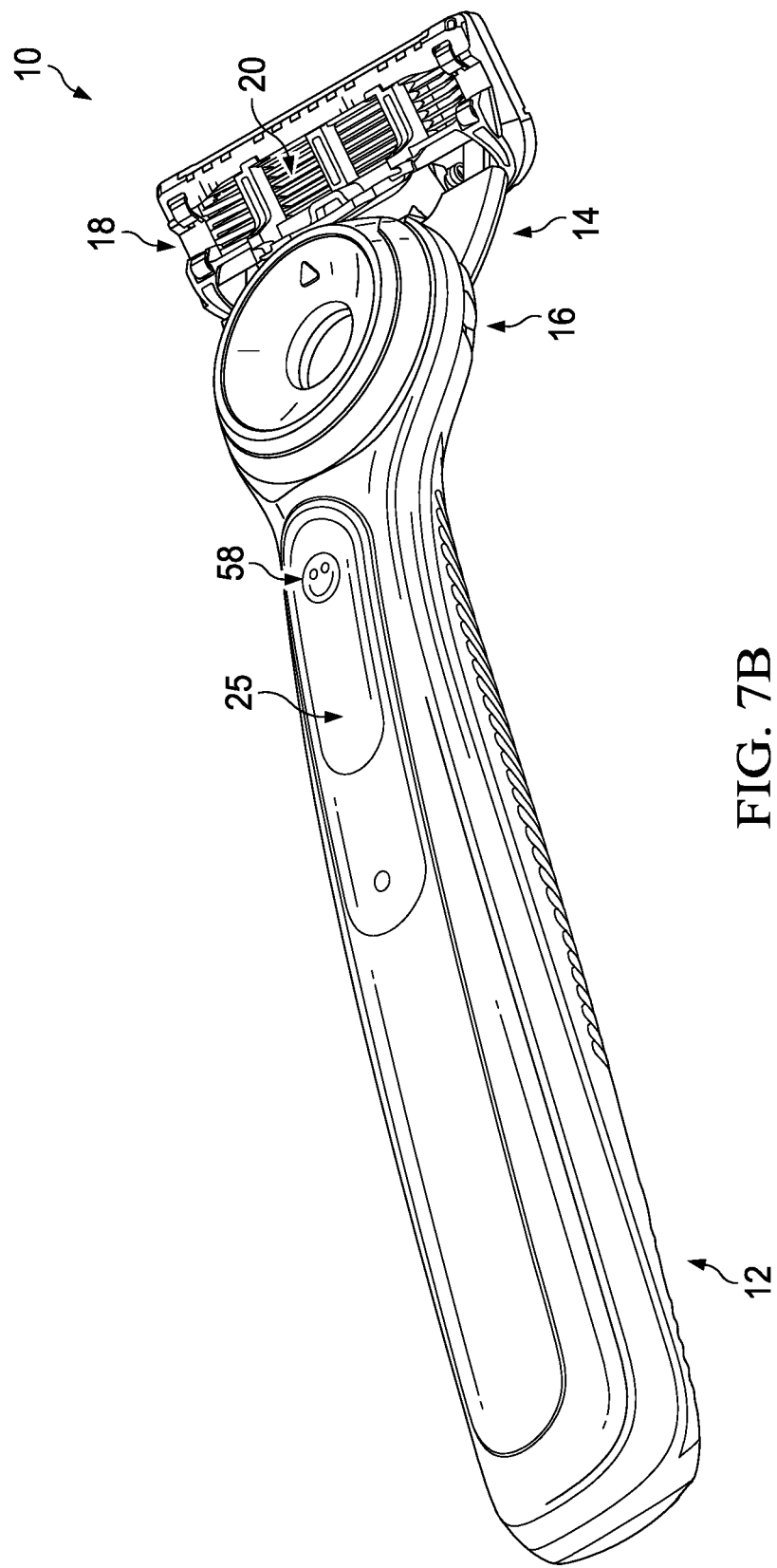
Figure 7C:
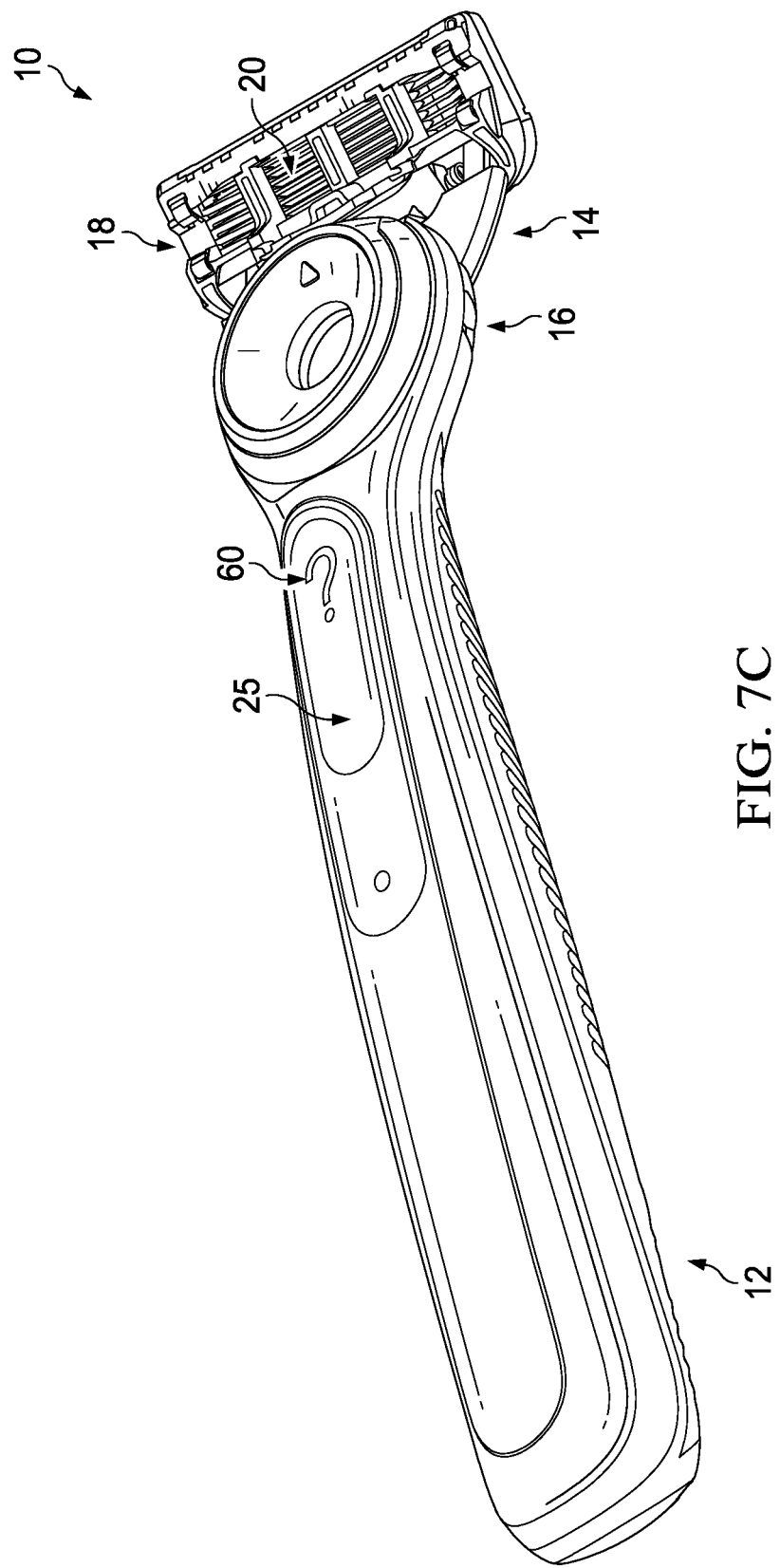

Referring to FIGS. 7A, 7B and 7C the consumer user interface 25 of the handle 12 of the personal care appliance 10 may display one or more notifications to the user. For example, the consumer user interface 25 may display a cartridge removal notification 56, such as an icon, informing the user that the cartridge 18 has been removed, as shown in FIG. 7A. The consumer user interface 25 may display a cartridge attachment notification 58, such as an icon, informing the user that the cartridge 18 is successfully attached and is ready for use. The consumer user interface 25 may change the display from the cartridge attachment notification 56 to the cartridge removal notification 56 based on the input from the control circuit 36 (FIG. 5) or the cloud 54 (FIG. 6). When the cartridge 18 is reattached or replaced with a new cartridge 18, the consumer user interface may display an input request notification 60 of a cartridge replacement condition, such as an icon, requesting confirmation from the user that the cartridge 18 has been replaced. If the consumer inputs the cartridge 18 has been replaced, a signal may be sent to reset the digital counter (FIGS. 5 and 6).

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm". Therefore, the term "about" should be interpreted as being within typical manufacturing tolerances, as well as measuring instrumentation tolerances to those skilled in the art.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of resetting a digital counter for a personal care appliance comprising the steps of:
    detecting presence of light with an optical sensor;
    sending an electrical output signal from the optical sensor to a control circuit;
    comparing the electrical output signal with the control circuit to a predetermined value or detecting a change over time in the electrical output signal from the optical sensor;
    sending a signal to a consumer user interface by the control circuit based on the electrical output signal and the predetermined value or based on the change in the electrical output signal from the optical sensor; and
    resetting the digital counter based on an input signal from the consumer user interface.

2. The method of claim 1 further comprising both comparing the electrical output signal with the control circuit to a predetermined value and detecting a change over time in the electrical output signal from the optical sensor.

3. The method of claim 1 further comprising displaying an image on the consumer user interface based on the electrical output signal sent to the control circuit.

4. The method of claim 1 further comprising sending a signal to a smart device by the control circuit based on the electrical output signal and the predetermined value.

5. The method of claim 4 further comprising requesting input from the user by the smart device.

6. The method of claim 1 further comprising requesting input from the user by the consumer user interface.

7. A method of resetting a digital counter for a personal care appliance comprising the steps of:
    detecting presence of light with an optical sensor;
    sending an electrical output signal from the optical sensor to a control circuit;
    comparing the electrical output signal with the control circuit to a predetermined value or detecting a change over time in the electrical output signal from the optical sensor;
    sending a signal to a smart device by the control circuit based on the electrical output signal and the predetermined value;
    resetting the digital counter based on an input signal the smart device.

8. The method of claim 7 further comprising both comparing the electrical output signal with the control circuit to a predetermined value and detecting a change over time in the electrical output signal from the optical sensor.

9. The method of claim 7 further comprising displaying an image on a consumer user interface based on the electrical output signal sent to the control circuit.

10. The method of claim 7 further comprising sending a signal to a consumer user interface on a handle of a personal care appliance by the control circuit based on the electrical output signal and the predetermined value.

11. The method of claim 7 further comprising requesting input from the user by the smart device based on the on the electrical output signal and the predetermined value.

12. The method of claim 7 further comprising requesting input from the user by the smart device and by a consumer user interface on a handle of a personal care appliance by the control circuit based on the electrical output signal and the predetermined value.

13. A method of resetting a digital counter for a personal care appliance comprising the steps of:
    detecting presence of light with an optical sensor;
    sending an electrical output signal from the optical sensor to a control circuit;
    comparing the electrical output signal to at least one predetermined value with the control circuit or detecting a change over time in the electrical output signal from the optical sensor by the control circuit;
    sending a signal from the control circuit to a cloud based on the electrical output signal of the optical sensor;
    sending a signal from the cloud to a smart device or a consumer user interface on a personal care appliance;
    resetting the digital counter by sending a signal from the smart device or the consumer user interface to the digital counter.

14. The method of claim 13 further comprising displaying a notification on the consumer user interface of a cartridge replacement condition.

15. The method of claim 13 further comprising displaying a notification on the consumer user interface of a cartridge removal condition.

16. The method of claim 13 further comprising processing the signal from the control circuit by the cloud.

17. The method of claim 13 further comprising sending the signal from the cloud to the smart device and resetting the digital counter by sending the signal from the smart device to the digital counter.

18. The method of claim 13 further comprising sending a signal from the cloud to the consumer user interface on a personal care appliance and resetting the digital counter by sending a signal from the consumer user interface to the digital counter.

19. The method of claim 18 further comprising displaying a cartridge removal notification on the consumer user interface.

20. The method of claim 18 further comprising displaying an input request notification on the consumer user interface of a cartridge replacement condition.

\* \* \* \* \*